(12) United States Patent
Miyamoto (10) Patent No.: US 11,846,667 B2
(45) Date of Patent: Dec. 19, 2023

(54) DISCHARGE DETECTION DEVICE

(71) Applicant: NITTO KOGYO CORPORATION, Nagakute (JP)

(72) Inventor: Atsushi Miyamoto, Nagakute (JP)

(73) Assignee: NITTO KOGYO CORPORATION, Nagakute (JP)

( * ) Notice: Subject to any disclaimer, the term of this patent is extended or adjusted under 35 U.S.C. 154(b) by 0 days.

(21) Appl. No.: 17/637,858

(22) PCT Filed: Aug. 24, 2020

(86) PCT No.: PCT/JP2020/031869
§ 371 (c)(1),
(2) Date: Feb. 24, 2022

(87) PCT Pub. No.: WO2021/039734
PCT Pub. Date: Mar. 4, 2021

(65) Prior Publication Data
US 2022/0276297 A1    Sep. 1, 2022

(30) Foreign Application Priority Data
Aug. 26, 2019    (JP) .................................. 2019-153870

(51) Int. Cl.
*G01R 31/14* (2006.01)
*G08B 21/18* (2006.01)

(52) U.S. Cl.
CPC .......... *G01R 31/14* (2013.01); *G08B 21/182* (2013.01); *G08B 21/185* (2013.01)

(58) Field of Classification Search
CPC ..... G01R 31/14; G08B 21/182; G08B 21/185
USPC .......................................................... 340/660
See application file for complete search history.

(56) References Cited

U.S. PATENT DOCUMENTS

| 4,582,974 A | * | 4/1986 | Itoh | ................. B23H 7/18 |
| | | | | 219/69.18 |
| 5,075,629 A | * | 12/1991 | Umemura | .............. G01R 31/12 |
| | | | | 340/646 |
| 5,223,795 A | * | 6/1993 | Blades | .................. G01R 31/66 |
| | | | | 324/613 |

(Continued)

FOREIGN PATENT DOCUMENTS

| JP | H9233683 A | 9/1997 |
| JP | H9327119 A | 12/1997 |

(Continued)

*Primary Examiner* — Zhen Y Wu
(74) *Attorney, Agent, or Firm* — THE WEBB LAW FIRM (57) ABSTRACT

A discharge detection device of the present invention is configured to be capable of detecting a discharge phenomenon via wiring, including: a noise detection section electrically connected to the wiring and configured to allow a noise component generated by the discharge phenomenon to be input via the wiring and configured to output the noise component if the noise component has a predetermined frequency or more; and an arithmetic section configured to determine whether a level of the noise component is high by comparing the level of the noise component with a threshold. The arithmetic section counts the number of occurrence of the discharge phenomenon if the level of the noise component is determined to be high, and performs a control process selected based on the number of occurrence of the discharge phenomenon.

5 Claims, 11 Drawing Sheets

(56) References Cited

U.S. PATENT DOCUMENTS

| | | | | |
|---|---|---|---|---|
| 5,475,312 | A * | 12/1995 | Sedding | G01R 31/12 361/33 |
| 5,488,304 | A * | 1/1996 | Hamade | G01R 19/15 324/520 |
| 5,726,576 | A * | 3/1998 | Miyata | G01R 29/0871 324/520 |
| 5,729,145 | A * | 3/1998 | Blades | G01R 31/1272 324/613 |
| 6,507,181 | B1 * | 1/2003 | Pakonen | G01R 31/12 324/541 |
| 9,696,365 | B2 * | 7/2017 | Yasukawa | G01R 31/007 |
| 2004/0246000 | A1 * | 12/2004 | Kuppuswamy | G01R 31/1254 324/536 |
| 2005/0134199 | A1 * | 6/2005 | Suzuki | H05B 41/2856 315/291 |
| 2007/0145981 | A1 * | 6/2007 | Tomita | G11C 29/028 324/509 |
| 2014/0049264 | A1 * | 2/2014 | Ganesh | G01R 31/52 324/551 |
| 2014/0218044 | A1 * | 8/2014 | Ostrovsky | H02H 1/0015 340/650 |
| 2014/0320139 | A1 * | 10/2014 | Renforth | G01R 31/11 324/415 |

FOREIGN PATENT DOCUMENTS

| | | |
|---|---|---|
| JP | 2007113960 A | 5/2007 |
| JP | 2017173008 A | 9/2017 |

* cited by examiner

EXAMPLE OF LED BLINK, BUZZER SOUND

• WHEN DETECTING FIRST DISCHARGE PHENOMENON

• WHEN DETECTING SECOND DISCHARGE PHENOMENON

DISCHARGE DETECTION DEVICE

CROSS-REFERENCE TO RELATED APPLICATIONS

This application is the United States national phase of International Application No. PCT/JP2020/031869 filed Aug. 24, 2020, and claims priority to Japanese Patent Application No. 2019-153870 filed Aug. 26, 2019, the disclosures of which are hereby incorporated by reference in their entirety.

BACKGROUND OF THE INVENTION

Field of the Invention

The present invention relates to a discharge detection device.

Description of Related Art

Japanese Patent Application Kokai Publication No. 2017-173008 discloses a system to detect high frequency noise generated by a discharge phenomenon using a CR circuit. The CR circuit is configured to connect a capacitor and a resistor in series and is electrically connected between different electrodes in a circuit. Such a CR circuit passes a noise component at a predetermined frequency or more. Measurement of the value of the voltage applied to both ends of the resistor in the CR circuit allows detection of abnormal discharge phenomena.

PRIOR ART DOCUMENTS

Patent Document

Patent Document 1: Japanese Patent Application Kokai Publication No. 2017-173008

SUMMARY OF THE INVENTION

Problems to be Solved by the Invention

For example, dust gathered between pins plugged into an outlet causes repeated spark discharge and carbonization of insulating resins. Such a carbonized insulating resin carries current between the plug pins. The current carried between the plug pins ignites the insulating resins of the outlet and the plug to cause a fire. Repeated discharge phenomena thus develop degradation of electrical circuit components and increase the risk of causing a fire. In spite of such a problem, there used to be no conventional techniques focusing on the number of occurrences of a discharge phenomenon.

The present invention has been made in view of the above problems and it is an object thereof to provide a discharge detection device capable of performing different processes in accordance with the number of occurrences of a discharge phenomenon.

Means to Solve the Problems (1) To achieve the above object, a discharge detection device of the present invention configured to be capable of detecting a discharge phenomenon via wiring, includes:
a noise detection section electrically connected to the wiring and configured to allow a noise component generated by the discharge phenomenon to be input via the wiring and configured to output the noise component if the noise component has a predetermined frequency or more; and
an arithmetic section configured to determine whether a level of the noise component is high by comparing the level of the noise component with a threshold, wherein
the arithmetic section counts the number of occurrence of the discharge phenomenon if the level of the noise component is determined to be high, and performs a control process selected based on the number of occurrence of the discharge phenomenon.

(2) It is preferred that the discharge detection device according to (1) above further includes: a storage section configured to store the number of occurrence of the discharge phenomenon; and a reset section configured to reset the number of occurrence of the discharge phenomenon stored in the storage section.

(3) It is preferred that the discharge detection device according to (1) or (2) above further includes: an output setting section configured to vary timing to output a signal from the arithmetic section based on an externally input signal.

(4) It is preferred that the discharge detection device according to any of (1) through (3) above further includes: an alarm for notification of occurrence of the discharge phenomenon using at least either light or sound, wherein the arithmetic section varies a mode of the notification by the alarm based on the number of occurrence of the discharge phenomenon.

(5) It is preferred that the discharge detection device according to (1) above further includes: a current detection section configured to measure a current value on the occurrence of the discharge phenomenon, wherein the arithmetic section performs a control process selected based on the current value.

Effects of the Invention

The present invention can provide a discharge detection device capable of varying signal output in accordance with the risk.

DESCRIPTION OF THE INVENTION

1. First Embodiment

At first, with reference to FIGS. 1 through 7, a description is given to the first embodiment of a discharge detection unit including a discharge detection device of the present invention.

Figure 1:
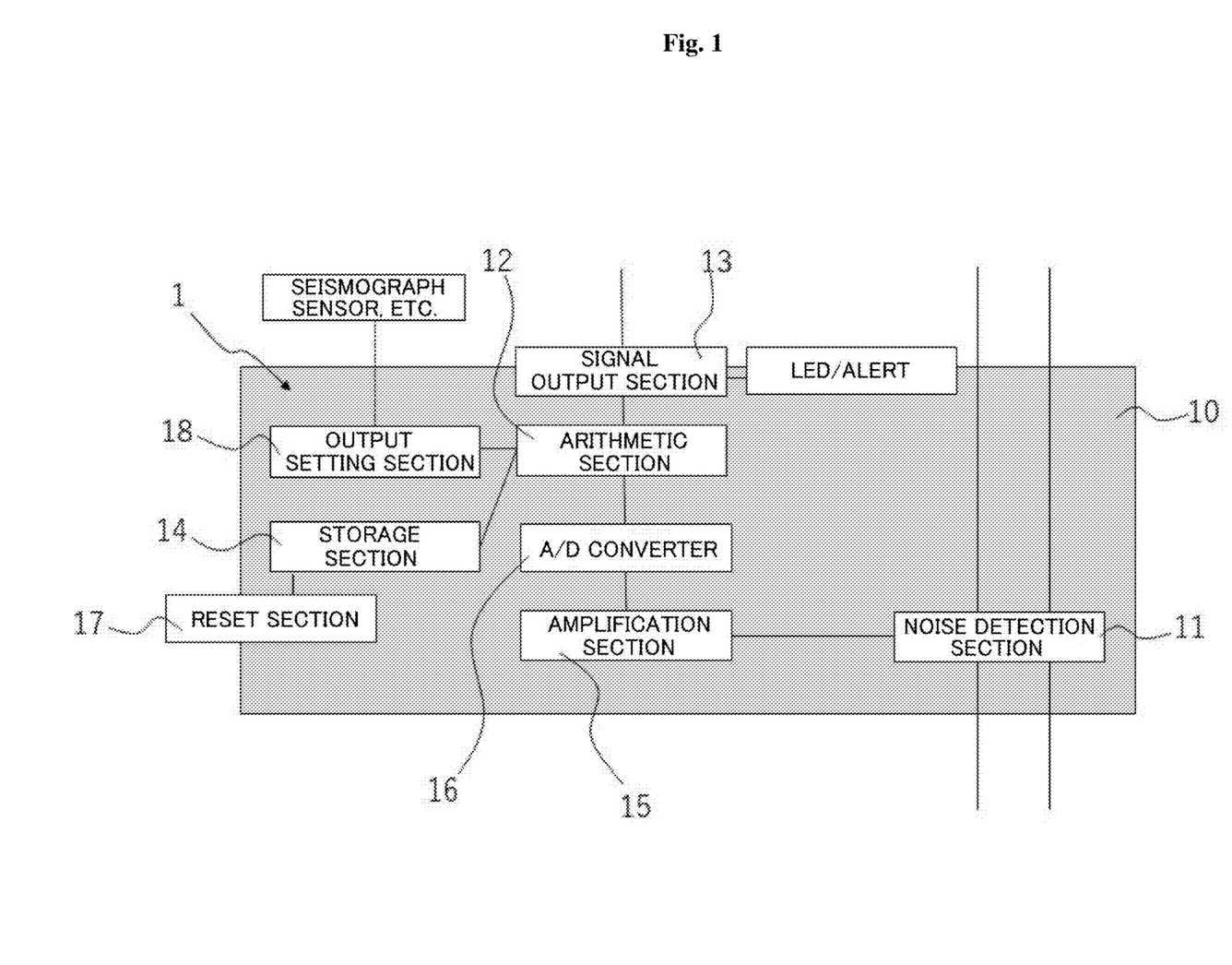
FIG. 1 is a block diagram illustrating a first embodiment of a discharge detection unit including a discharge detection device of the present invention.

FIG. 1 illustrates a configuration of a discharge detection unit 10 with a built-in discharge detection device 1. The discharge detection unit 10 in the present embodiment is designed to integrate components of the discharge detection device 1 into one unit. The discharge detection unit 10 is electrically connected to, for example, indoor wiring in a house. The discharge detection unit 10 includes a noise detection section 11, an arithmetic section 12, a signal output section 13, and a storage section 14 as main components of the discharge detection device 1. The discharge detection unit 10 further includes an amplification section 15, an A/D converter 16, a reset section 17, and an output setting section 18 as subordinate components of the discharge detection device 1. The "LED/ALERT" in FIG. 1 is an alarm, such as an LED and a buzzer. The discharge detection unit 10 in the present embodiment is configured by building these components in one housing, not shown.

Figure 10:
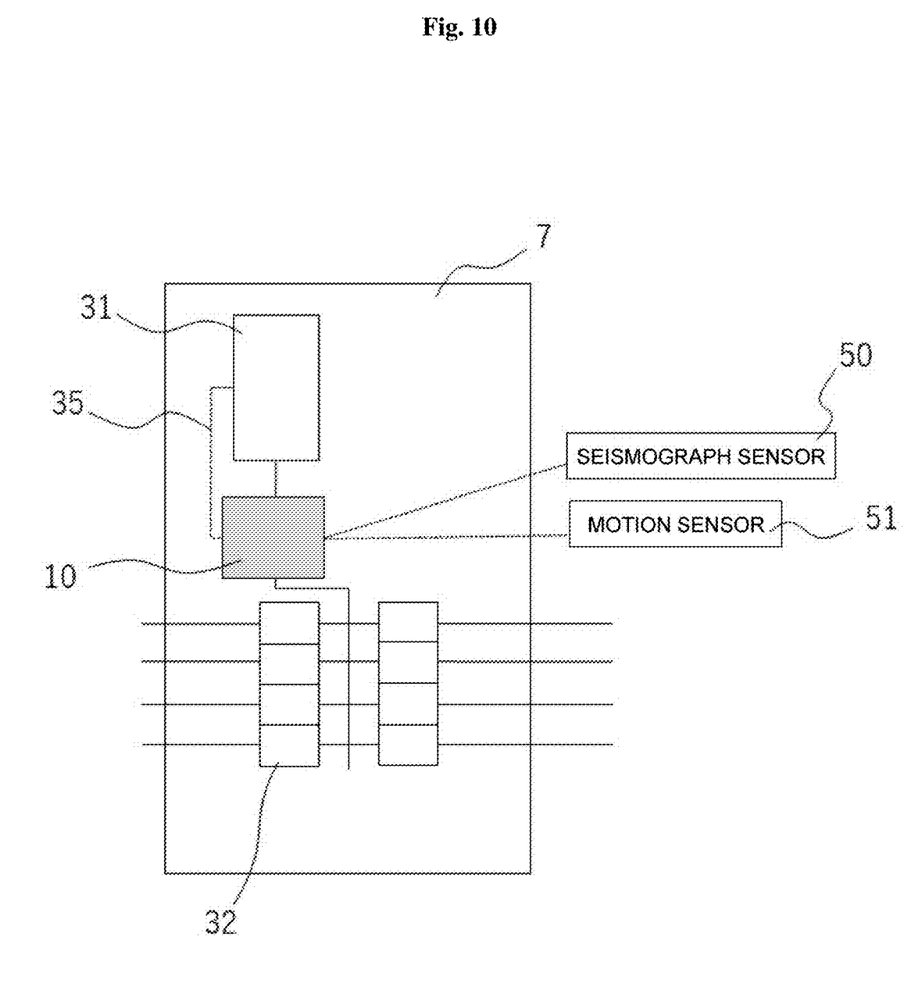
FIG. 10 is a schematic diagram illustrating a distribution board with a built-in discharge detection unit.

The noise detection section 11 is electrically connected to, for example, a secondary side of a main breaker 31 configuring a distribution board 7 illustrated in FIG. 10. The noise detection section 11 is a high pass filter that passes noise components at frequencies higher than a cutoff frequency generated in an alternating current circuit. In the present embodiment, such a noise component passed by the noise detection section 11 is referred to as a "detected signal". The detected signal output from the noise detection section 11 is amplified by the amplification section 15 and converted to a digital signal by the A/D converter 16. The detected signal converted to a digital signal is output to the arithmetic section 12.

The arithmetic section 12 controls behavior of the discharge detection unit 10. The arithmetic section 12 determines whether a discharge phenomenon has occurred based on the detected signal converted to a digital signal. Specifically, the arithmetic section 12 determines that a discharge phenomenon has occurred if a detected signal at high noise levels is continuously input for a predetermined period of time. If determining that a discharge phenomenon has occurred, the arithmetic section 12 causes the signal output section 13 to output a signal to perform a control process of an LED and a buzzer. If determining that a discharge phenomenon has occurred, the arithmetic section 12 causes the storage section 14 to store information on the discharge phenomenon, such as the date and time of occurrence, the number of occurrences, and the location of occurrence. For example, the arithmetic section 12 varies a process of controlling the LED and the buzzer connected to the signal output section 13 based on the number of occurrences of a discharge phenomenon stored in the storage section 14. That is, an increase in the number of occurrences of a discharge phenomenon also causes an increase in the risk of causing a fire. The discharge detection unit 10 varies the process of controlling the LED and the buzzer in accordance with the degree of the risk of causing a fire.

The signal output section 13 is preferably electrically connected to the main breaker 31 via an output line 35 illustrated in FIG. 10. If determining that a discharge phenomenon has occurred, the arithmetic section 12 causes a cutoff signal to be output via the signal output section 13 to interrupt the main breaker 31.

The reset section 17 is, for example, a button provided to protrude from the housing of the discharge detection unit 10. For example, it is possible to reset behavior of the LED and the buzzer by operating the reset section 17. It is also possible to reset output of a cutoff signal to the main breaker 31 by operating the reset section 17. Moreover, the number of occurrences of a discharge phenomenon stored in the storage section 14 may be added by operating the reset section 17.

The reset section 17 may be configured to reset information stored in the storage section 14 by particular operation, for example, by holding down the reset section 17. In addition, the reset section 17 may have a plurality of modes of operation respectively assigned to different commands. In this case, it is possible to perform one or both of reset of the LED and the buzzer and reset of the storage section 14 in accordance with the mode of operation of the reset section 17. This allows different commands to be performed without providing a plurality of buttons and thus reduction in the number of components.

The output setting section 18 controls timing to output a signal from the arithmetic section 12 to the signal output section 13. The arithmetic section 12 outputs a signal at predetermined timing to control the behavior of the discharge detection unit 10. For example, if determining that a discharge phenomenon has occurred, the arithmetic section 12 outputs a cutoff signal at predetermined timing. The cutoff signal is input to the main breaker 31 via the signal output section 13. The output setting section 18 delays or advances the timing to output a signal from the arithmetic section 12 based on an externally input signal. A user can arbitrarily set the timing to output a signal from the output setting section 18 to the arithmetic section 12.

The output setting section 18 is electrically connected to a seismograph sensor 50, a motion sensor 51, and the like. For example, if the seismograph sensor 50 detects an earthquake with predetermined seismic intensity or more at the same timing as the occurrence of a discharge phenomenon, the output setting section 18 immediately causes the arithmetic section 12 to output a cutoff signal regardless of the number of occurrences of a discharge phenomenon. If the motion sensor 51 installed in a room detects a person at the same timing as the occurrence of a discharge phenomenon, the output setting section 18 causes the arithmetic section 12 to delay output of a cutoff signal regardless of the number of occurrences of a discharge phenomenon. This allows use of lighting equipment until the person leaves the room.

The storage section 14 stores the information on the discharge phenomenon output from the arithmetic section 12. The information on the discharge phenomenon includes, for example, the date and time of occurrence of the discharge phenomenon, the number of occurrences, the location of occurrence, the discharge current value, the duration time of one discharge phenomenon, the time interval between a previously occurred discharge phenomenon and a subsequently occurred discharge phenomenon, and the like. The arithmetic section 12 is capable of performing various control processes based on the information stored in the storage section 14.

For example, the arithmetic section 12 is capable of determining whether the time interval between a plurality of discharge phenomena is long or short. If a plurality of discharge phenomena occur in short time intervals, the arithmetic section 12 may cause the LED and the buzzer to be immediately activated or cause a cutoff signal to be immediately output. In addition, if the discharge current value exceeds a threshold, the arithmetic section 12 may also cause the LED and the buzzer to be immediately activated or cause a cutoff signal to be immediately output. Moreover, if a detected signal at high noise levels continues for more than a "predetermined period of time", the arithmetic section 12 may cause a cutoff signal to be immediately output. Optionally, the storage section 14 may store a threshold at a low noise level that is not determined as a discharge phenomenon by the arithmetic section 12, and if a detected signal exceeding this threshold is input, the arithmetic section 12 may cause the LED and the buzzer to be activated for warning the user.

1.1 Main Flow

Figure 2:
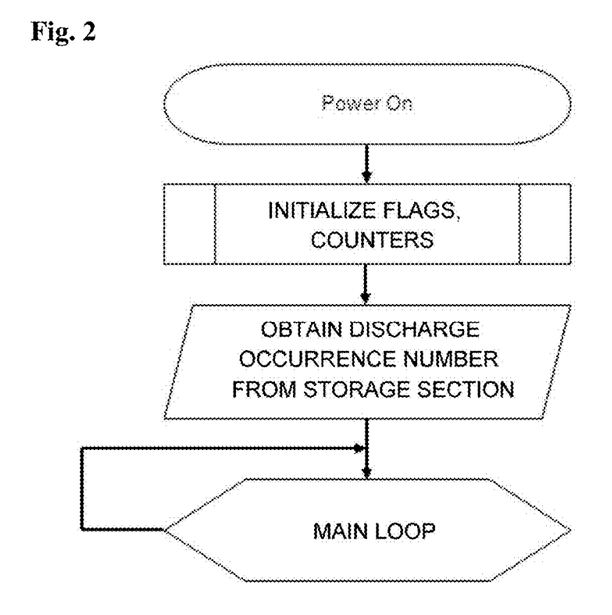
FIG. 2 is a flowchart illustrating a main flow of a process performed by the discharge detection unit in the first embodiment.

With reference to FIG. 2, a main flow of the process performed by the discharge detection unit 10 is then described. In FIG. 2, when the power supply of the discharge detection unit 10 is turned on, the arithmetic section 12 initializes flags and counters. The arithmetic section 12 then obtains the number of occurrences of discharge from the storage section 14. The arithmetic section 12 then repeatedly performs the main loop. A description is given below to two embodiments of the main loop.

1.2 First Embodiment of Main Loop

Figure 3:
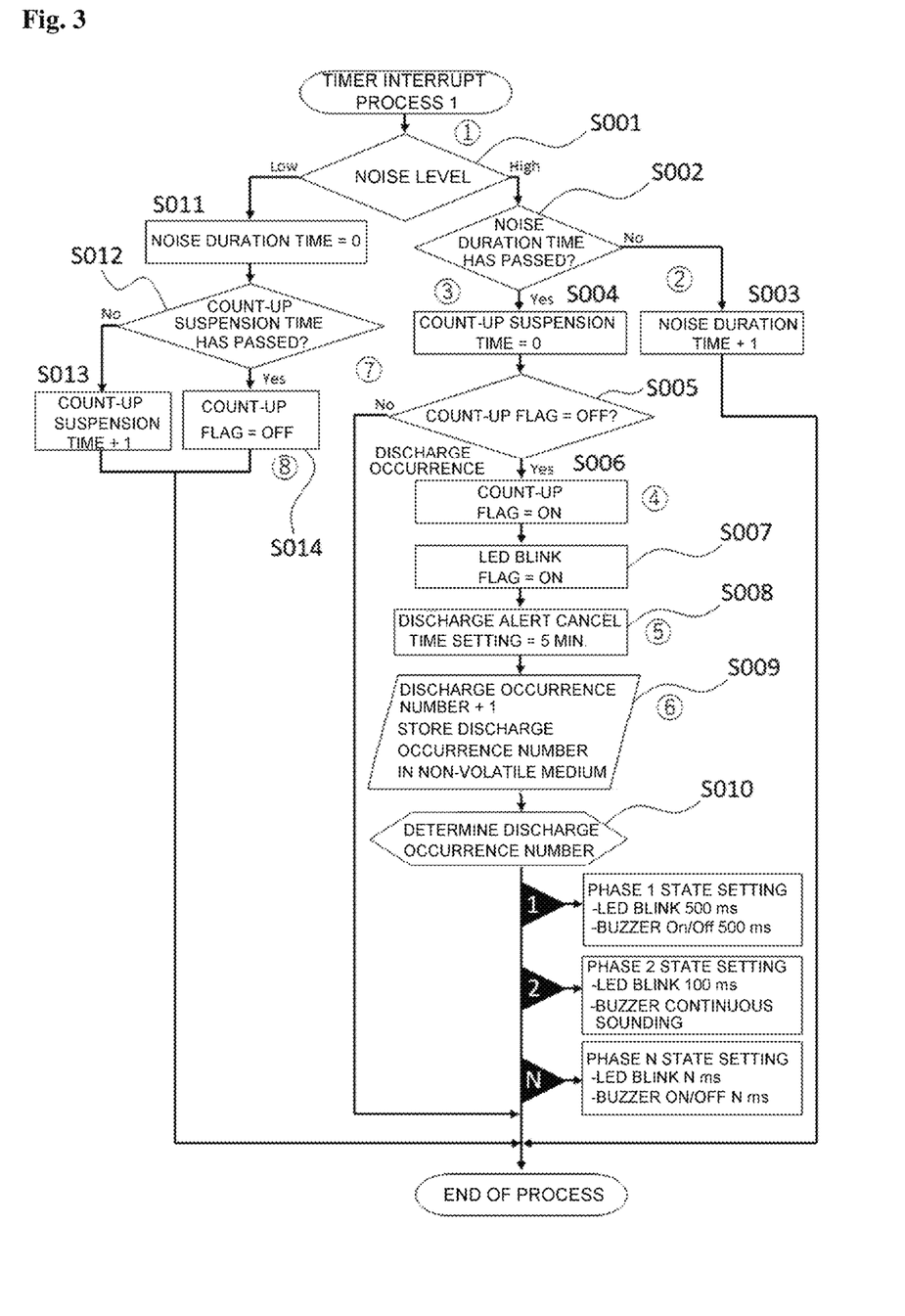
FIG. 3 is a flowchart illustrating a first embodiment of a main loop in FIG. 2.

FIG. 3 illustrates the first embodiment of the main loop in FIG. 2. The arithmetic section 12 generates an interrupt, for example, every 100 ms to perform the process of the main loop illustrated in FIG. 3.

At step S001, the arithmetic section 12 determines whether the noise level of a detected signal is high or low by comparing the noise level with a threshold. If the noise level is determined to be high (High), the process goes on to step S002 and the arithmetic section 12 determines whether a predetermined "noise duration time" has passed.

The "noise duration time" means the time while high noise levels are continued. As illustrated by the "noise duration time" in FIG. 4, the "noise duration time" in the present embodiment is set to "500 ms". As described above, the arithmetic section 12 repeats the process of the main loop every 100 ms. If the arithmetic section 12 determines that the noise level is high at step S001 five times in a row, the "noise duration time" is "500 ms". The discharge phenomenon the number of occurrences of which is counted by the arithmetic section 12 is defined by the "noise duration time". In other words, if high noise levels have continued for 500 ms or more, the arithmetic section 12 determines that one discharge phenomenon has occurred (refer to step S009 described later). That is, instantaneous noise for less than 500 ms is excluded from the definition of the discharge phenomenon and the number of occurrences of which is not counted by the arithmetic section 12. It should be noted that the "noise duration time" at step S002 is not limited to "500 ms" and may be set to an arbitrary period of time.

If the arithmetic section 12 determines that the "noise duration time" has not passed (No) at step S002, the process goes on to step S003 and the arithmetic section 12 adds "1" to the "noise duration time". The arithmetic section 12 then terminates the process of the main loop and repeats the process of the main loop again from step S001.

At step S003, "1" added to the "noise duration time" is equivalent to the time of "100 ms" to repeat the process of the main loop. When the "noise duration time" at step S003 reaches "5", in other words, the "noise duration time" reaches "500 ms", the arithmetic section 12 determines that the "noise duration time" has passed (Yes) at step S002. It should be noted that the period of time equivalent to "1" varies depending on the time to generate an interrupt and thus is not limited to "100 ms".

If the arithmetic section 12 determines that the "noise duration time" has passed at step S002, the process goes on to step S004 and the arithmetic section 12 sets "count-up suspension time" to 0. The process then goes on to step S005 and the arithmetic section 12 determines whether a "count-up flag" is "OFF".

Figure 4:
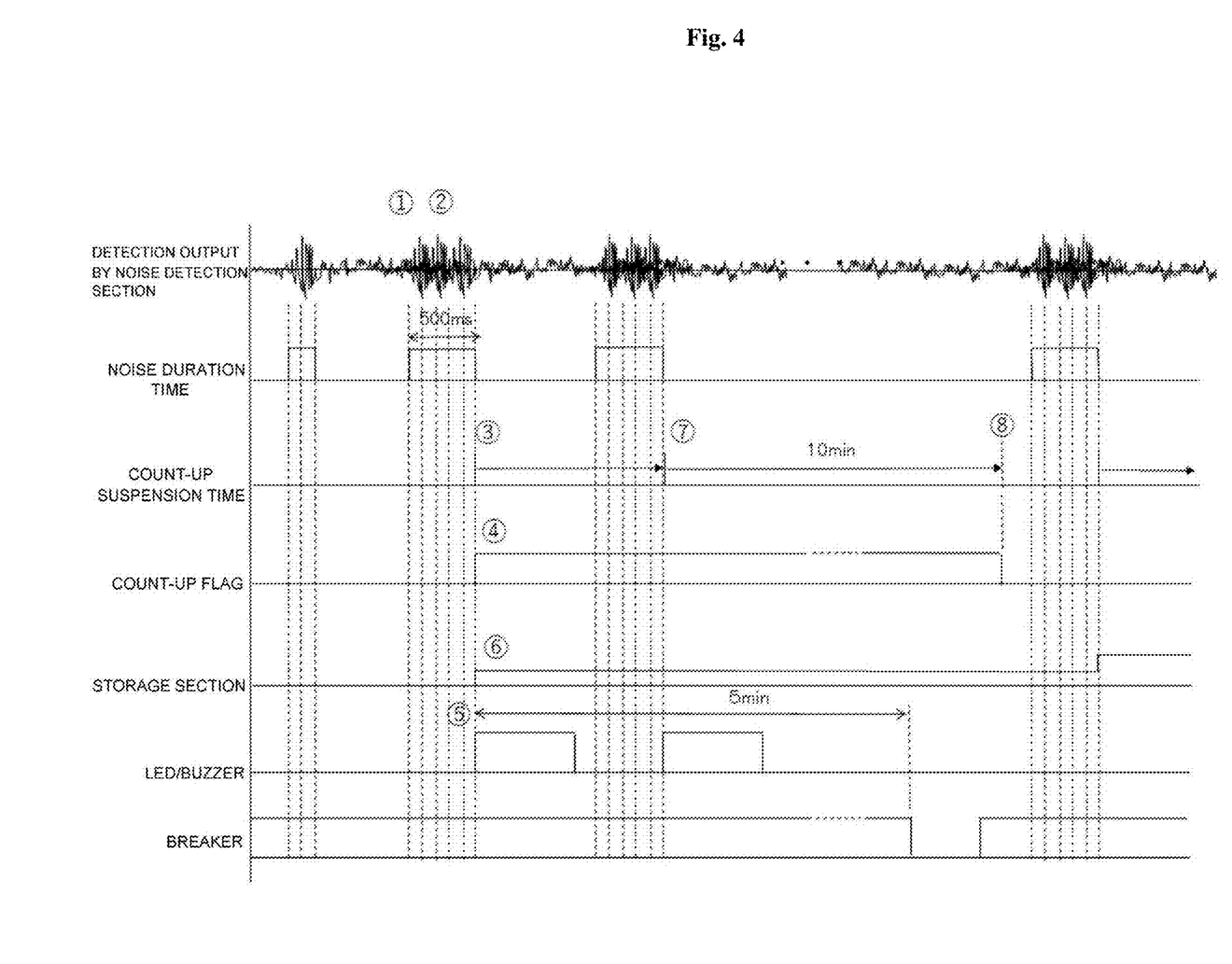
FIG. 4 is a timing diagram illustrating timing relationship of processes performed in the main loop in FIG. 3.
Figure 5:
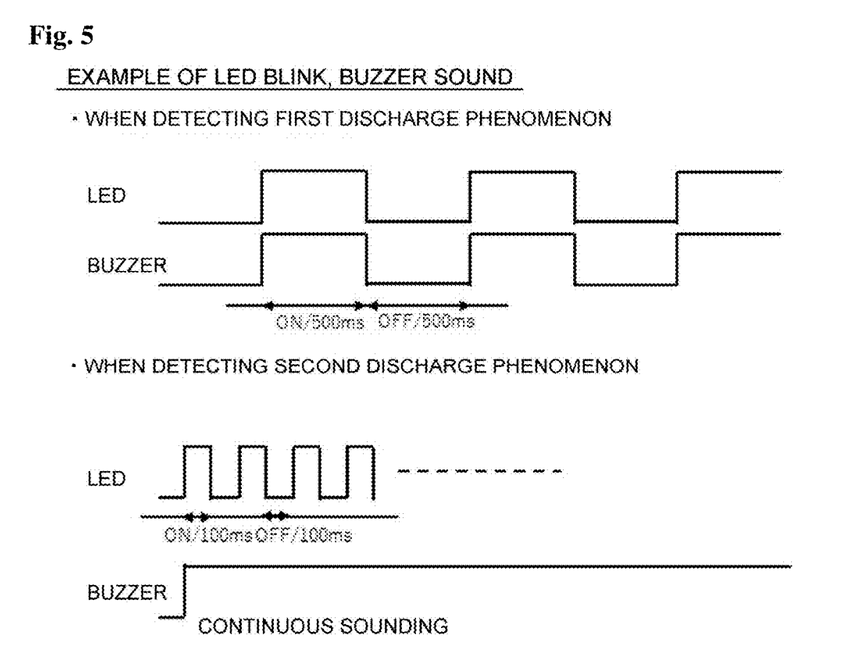
FIG. 5 is a timing diagram illustrating behavior of an LED and a buzzer in accordance with the number of occurrences of a discharge phenomenon.

The "count-up suspension time" at step S004 is the period of time, for example, not to count the number of occurrences of subsequent discharge phenomena occurred within a predetermined period of time after the occurrence of the previous discharge phenomenon. The "count-up flag" at step S005 indicates whether the process of measuring the "count-up suspension time" is being performed. The "count-up flag" turned "OFF" indicates that the process of measuring the "count-up suspension time" is not being performed. Meanwhile, the "count-up flag" turned "ON" indicates that the process of measuring the "count-up suspension time" is being performed. As illustrated in FIG. 4, the "count-up suspension time" is set to, for example, "10 min".

Figure 6:
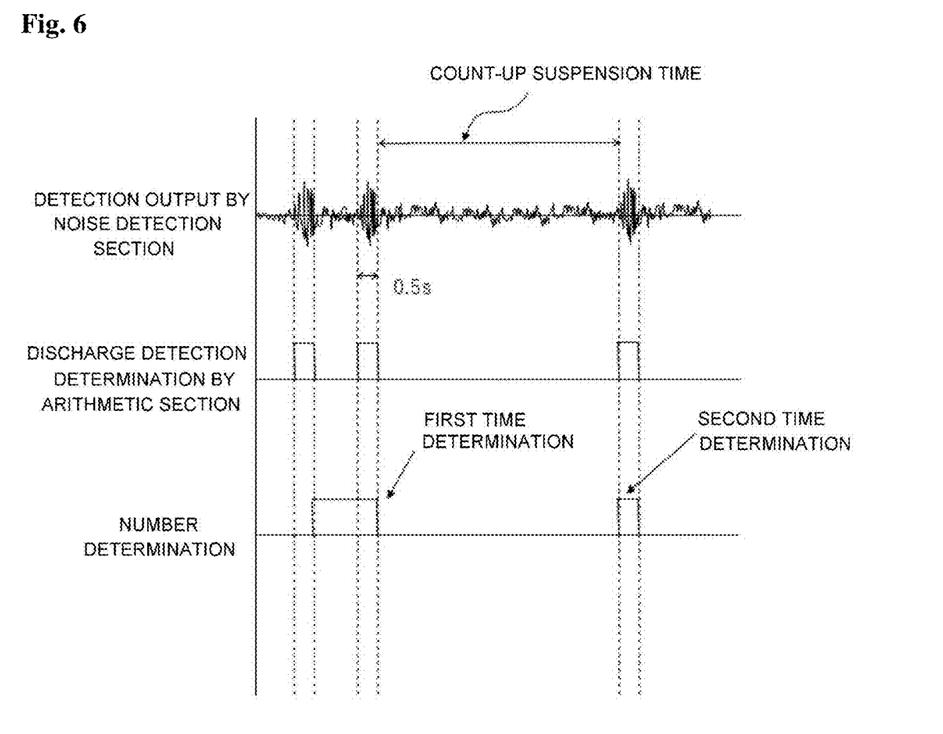
FIG. 6 is a timing diagram illustrating a process to count the number of occurrences of a discharge phenomenon.

If the "count-up flag" is turned "OFF", the arithmetic section 12 performs the process of steps S006 through S010 to count the number of occurrences of a discharge phenomenon. Meanwhile, if the "count-up flag" is turned "ON", the arithmetic section 12 does not count the number of occurrences of a discharge phenomenon occurred within "10 min". As illustrated in FIG. 6, the second discharge phenomenon occurred before passing the "count-up suspension time" after the occurrence of the first discharge phenomenon is counted as one discharge phenomenon together with the first discharge phenomenon. Such a "count-up suspension time" and a "count-up flag" allow appropriate count of the number of occurrences of a discharge phenomenon without repeating the process of steps S006 through S010 even if the noise level repeatedly varies between high and low levels in a short period of time.

If the arithmetic section 12 determines that the "count-up flag" is turned "OFF" (Yes) at step S005, the process goes on to step S006 and the arithmetic section 12 turns "ON" the "count-up flag". This causes a discharge phenomenon occurred during the "10 min" not to be counted by the arithmetic section 12.

The process then goes on to step S007 and the arithmetic section 12 turns "ON" an "LED blink flag". The process then goes on step S008 and the arithmetic section 12 sets "discharge alert cancel time" to "5 minutes". It should be noted that the "discharge alert cancel time" is not limited to "five minutes" and may be set to an arbitrary period of time.

The process then goes on to step S009 and the arithmetic section 12 causes a non-volatile medium (storage section 14) to store a value obtained by adding "1" to the "number of occurrences of discharge". The process then goes on to step S010 and the arithmetic section 12 determines the current "number of occurrences of discharge".

If determining that the "number of occurrences of discharge" is one at step S010, the arithmetic section 12 performs a predetermined "phase 1 state setting". The "phase 1 state setting" is a control process to blink the LED at 500-ms intervals and to turn ON/OFF the buzzer at 500-ms intervals (refer to FIG. 5).

If determining that the "number of occurrences of discharge" is two at step S010, the arithmetic section 12 performs a predetermined "phase 2 state setting". The "phase 2 state setting" is a control process to blink the LED at 100-ms intervals and to turn ON/OFF the buzzer at 100-ms intervals (refer to FIG. 5).

If determining that the "number of occurrences of discharge" is N of three or more at step S010, the arithmetic section 12 performs a predetermined "phase N state setting". The "phase N state setting" is a control process to blink the LED at N-ms intervals and to turn ON/OFF the buzzer at N-ms intervals. The N ms is a shorter period of time than 100 ms. It should be noted that if the "number of occurrences of discharge" reaches a predetermined number, the arithmetic section 12 preferably outputs a cutoff signal to interrupt the main breaker 31.

Meanwhile, if the arithmetic section 12 determines that the "count-up flag" is not turned "OFF" (No) at step S005, the arithmetic section 12 terminates the process of the main loop and repeats the process of the main loop again from step S001.

If the arithmetic section 12 determines that the noise level is low (Low) at step S001, the process goes on to step S011 and the arithmetic section 12 sets the "noise duration time" to "0". The process then goes on to step S012 and the arithmetic section 12 determines whether the "count-up suspension time" has passed. If the arithmetic section 12 determines that the "count-up suspension time" has not passed (No), the process goes on to step S013 and the arithmetic section 12 adds "1" to the "count-up suspension time" and then terminates the process of the main loop. Meanwhile, if the arithmetic section 12 determines that the "count-up suspension time" has passed (Yes), the process goes on to step S014 and the arithmetic section 12 turns "OFF" the "count-up flag" and then terminates the process of the main loop.

1.3 Second Embodiment of Main Loop

Figure 7:
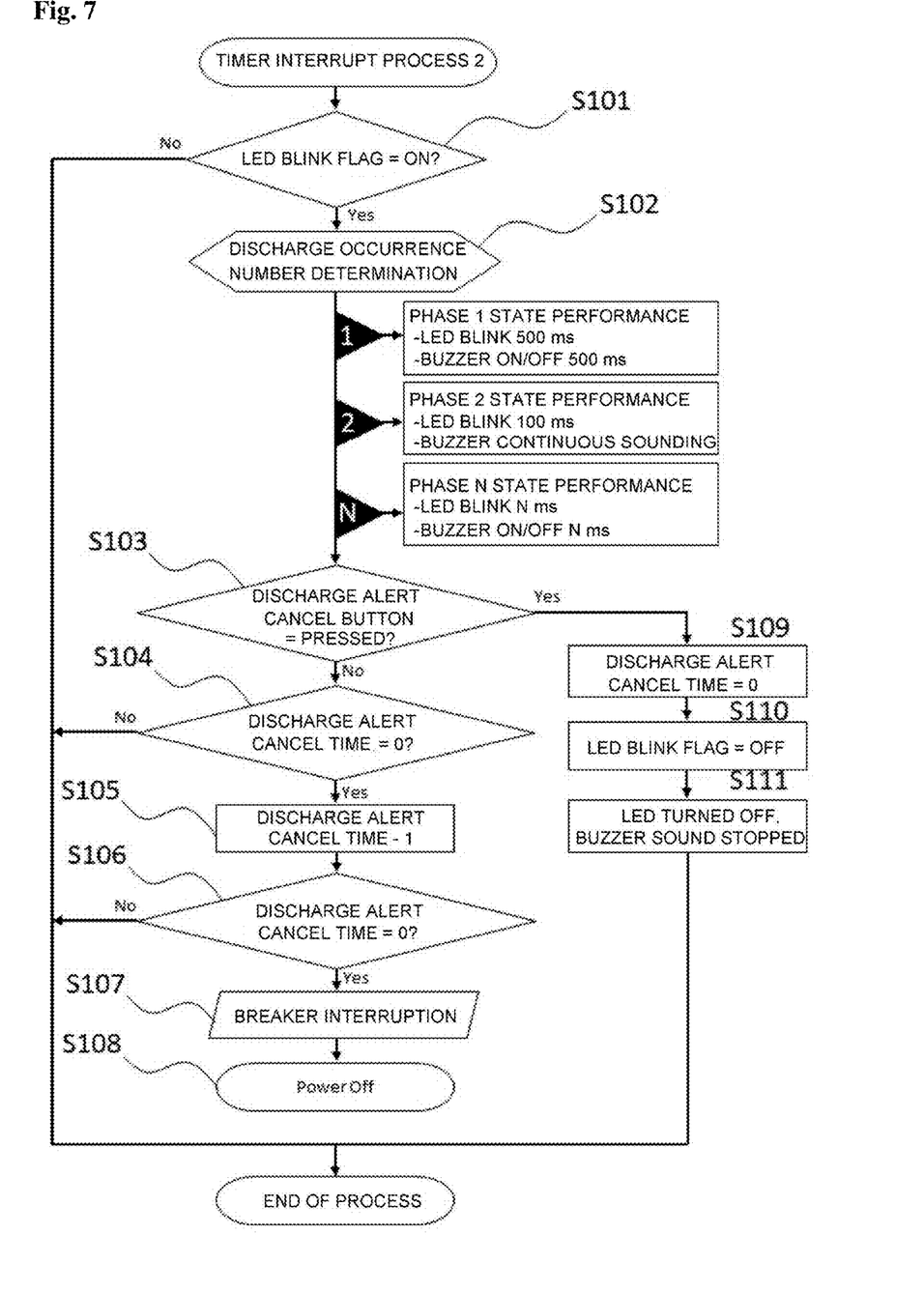
FIG. 7 is a flowchart illustrating a second embodiment of the main loop in FIG. 2.

FIG. 7 illustrates the second embodiment of the main loop in FIG. 2. The arithmetic section 12 generates an interrupt, for example, every 100 ms to perform the process of the main loop illustrated in FIG. 7.

At step S101, the arithmetic section 12 determines whether the "LED blink flag" is turned "ON". If the arithmetic section 12 determines that the "LED blink flag" is turned "ON" (Yes), the process goes on to step S102 and the arithmetic section 12 determines the current "number of occurrences of discharge".

If determining that the "number of occurrences of discharge" is one at step S102, the arithmetic section 12 performs a predetermined "phase 1 state setting". The "phase 1 state setting" is a control process to blink the LED at 500-ms intervals and to turn ON/OFF the buzzer at 500-ms intervals (refer to FIG. 5).

If determining the "number of occurrences of discharge" is two at step S102, the arithmetic section 12 performs a predetermined "phase 2 state setting". The "phase 2 state setting" is a control process to blink the LED at 100-ms intervals and to turn ON/OFF the buzzer at 100-ms intervals (refer to FIG. 5).

If determining the "number of occurrences of discharge" is N of three or more at step S102, the arithmetic section 12 performs a predetermined "phase N state setting". The "phase N state setting" is a control process to blink the LED at N-ms intervals and to turn ON/OFF the buzzer at N-ms intervals. The N ms is a shorter period of time than 100 ms.

The process then goes on to step S103 and the arithmetic section 12 determines whether a "discharge alert cancel button", which is the reset section 17, is pressed down. If the arithmetic section 12 determines that the "discharge alert cancel button" is not pressed down (No), the process goes on to step S104 and the arithmetic section 12 determines whether the "discharge alert cancel time" is not "0".

The "discharge alert cancel time" is the time until "breaker interruption" at step S107 is performed. Until the "discharge alert cancel time" has passed, it is possible to cancel "discharge alert" of blinking the LED and sounding the buzzer by pressing down the "discharge alert cancel button". The "discharge alert cancel time" may be set to an arbitrary period of time. The "discharge alert cancel time" in the present embodiment is set to, for example, five minutes.

If the arithmetic section 12 determines that the "discharge alert cancel time" is not "0" (Yes) at step S104, the process goes on to step S105 and the arithmetic section 12 subtracts "1" from the "discharge alert cancel time". The process then goes on to step S106 and the arithmetic section 12 determines whether the "discharge alert cancel time" is "0".

If the arithmetic section 12 determines that the "discharge alert cancel time" is "0" (Yes) at step S106, the process goes on to step S107 and the arithmetic section 12 performs "breaker interruption". Specifically, the arithmetic section 12 causes a cutoff signal to be output via the signal output section 13 to interrupt the main breaker 31. The power supply to the wiring and electrical appliances where the discharge phenomenon occurred is thus cut off (step S108).

Meanwhile, if the arithmetic section 12 determines that the "discharge alert cancel button" is pressed down (Yes) at step S103, the process goes on to step S109 and the arithmetic section 12 sets the "discharge alert cancel time" to "0". The process then goes on to step S110 and the arithmetic section 12 turns "OFF" the "LED blink flag". The process then goes on to step S111 and the arithmetic section 12 turns off the LED and stops sounding of the buzzer. The arithmetic section 12 then terminates the process of the main loop and repeats the process of the main loop again from step S001.

If determining that the "discharge alert cancel time" is "0" (No) at step S104, the arithmetic section 12 terminates the process of the main loop and repeats the process of the main loop again from step S001.

If determining that the "discharge alert cancel time" is not "0" (No) at step S106, the arithmetic section 12 terminates the process of the main loop and repeats the process of the main loop again from step S001.

2. Second Embodiment

Figure 8:
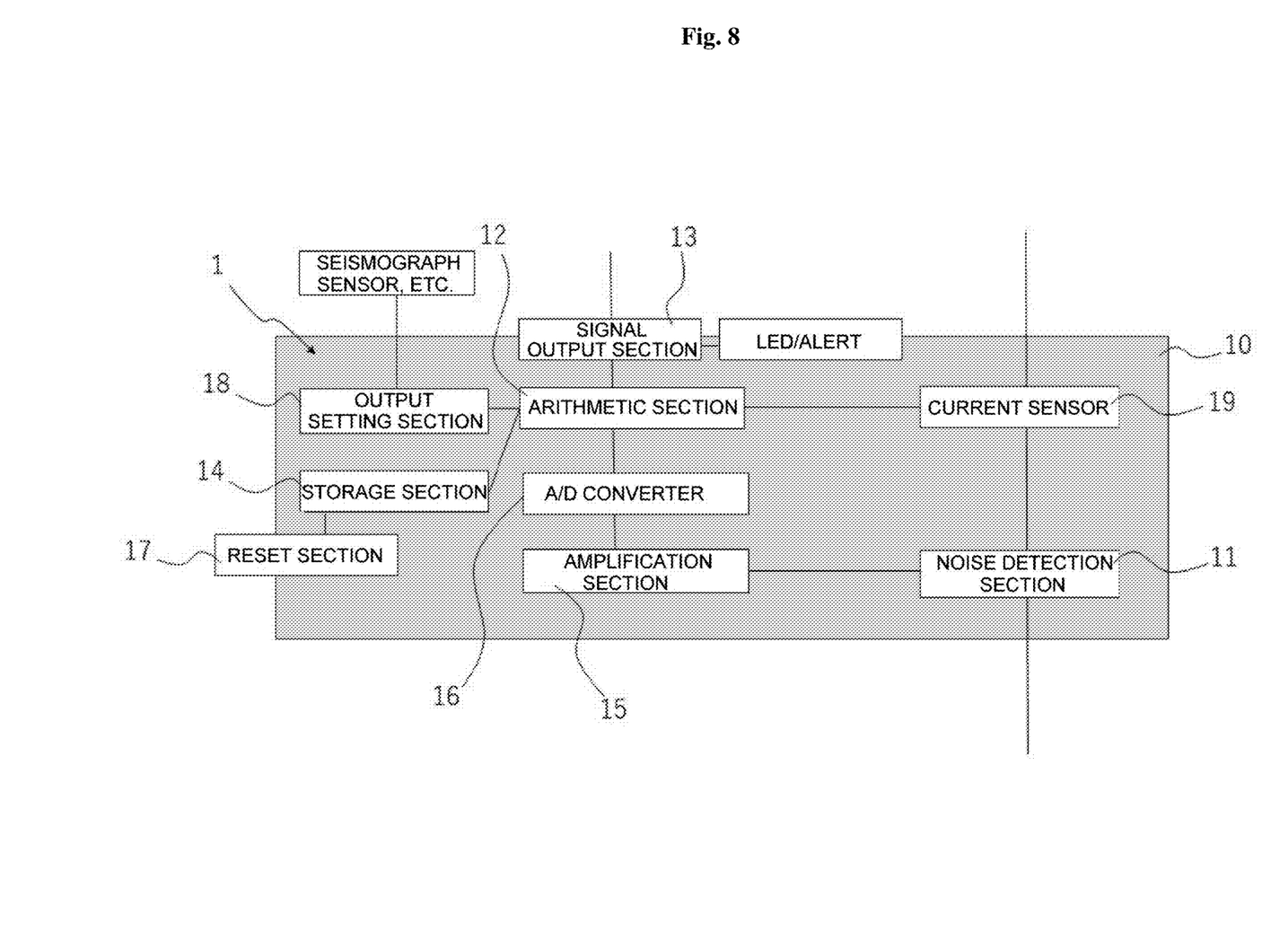
FIG. 8 is a block diagram illustrating a second embodiment of the discharge detection unit including the discharge detection device of the present invention.
Figure 9:
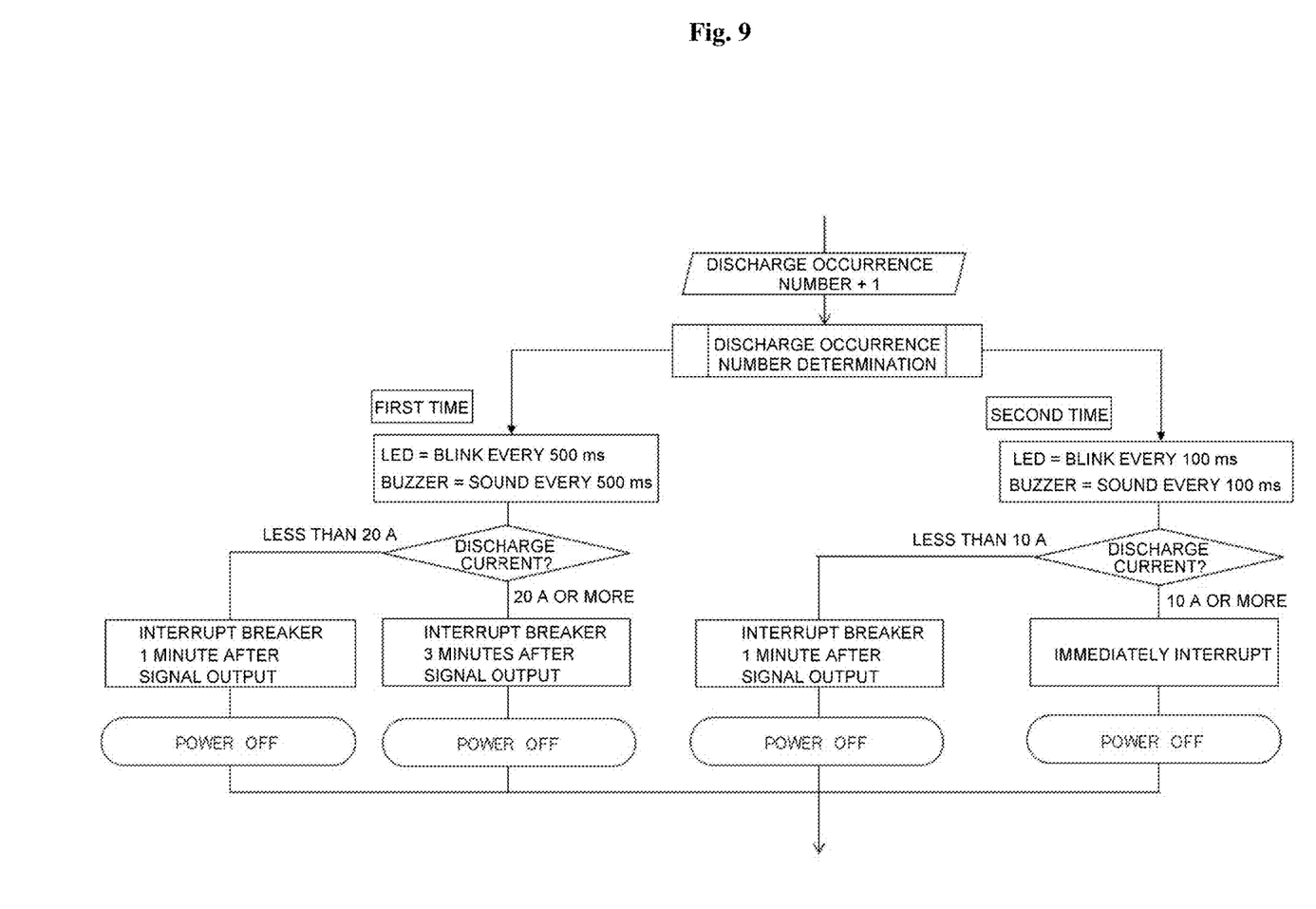
FIG. 9 is a flowchart illustrating a process performed by the discharge detection unit in the second embodiment.

With reference to FIGS. 8 and 9, a description is then given to the second embodiment of the discharge detection unit including the discharge detection device of the present invention.

A discharge detection unit 10 in the second embodiment illustrated in FIG. 8 includes a current sensor 19. The rest of the configuration is the same as the discharge detection unit 10 in the first embodiment illustrated in FIG. 1. The current sensor 19 is electrically connected to, for example, a secondary side of a main breaker 31 configuring a distribution board 7 illustrated in FIG. 10.

The current sensor 19 measures the current value on the occurrence of a discharge phenomenon. The current value measured by the current sensor 19 is output to the arithmetic section 12. The arithmetic section 12 causes the storage section 14 to store the current value measured by the current sensor 19. If a discharge phenomenon occurs, the arithmetic section 12 varies a control process to be subsequently performed based on the current value stored in the storage section 14. For example, the arithmetic section 12 varies timing to output a cutoff signal based on the current value stored in the storage section 14. The timing to interrupt the main breaker 31 is thus varied.

For example, as illustrated in the flowchart of FIG. 9, if the "number of occurrences of a discharge phenomenon" is the "first time", the arithmetic section 12 determines whether the current value stored in the storage section 14 is "20 A or more". If determining that the current value is not "20 A or more", the arithmetic section 12 performs "breaker interruption" "1 minute later". Meanwhile, if determining that the current value is "20 A or more", the arithmetic section 12 performs "breaker interruption" "3 minutes later".

If the "number of occurrences of a discharge phenomenon" is the "second time", the arithmetic section 12 determines whether the current value stored in the storage section 14 is "10 A or more". If determining that the current value is not "10 A or more", the arithmetic section 12 performs "breaker interruption" "1 minute later". Meanwhile, if determining that the current value is "10 A or more", the arithmetic section 12 immediately performs "breaker interruption".

3. One Embodiment of Distribution Board

FIG. 10 illustrates the distribution board 7 with the built-in discharge detection unit 10 described above. The distribution board 7 includes the main breaker 31 and branch breakers 32. The noise detection section 11 and the current sensor 19 of the discharge detection unit 10 are electrically connected to the secondary side of the main breaker 31 and a primary side of the branch breakers 32. In addition, the signal output section 13 of the discharge detection unit 10 is electrically connected to the main breaker 31 via the output line 35. A cutoff signal output from the arithmetic section 12 is input to the main breaker 31 via the signal output section 13 and the output line 35. The input of the cutoff signal causes interruption of the main breaker 31. Power supply to the wiring and electrical appliances is thus cut off.

Figure 11:
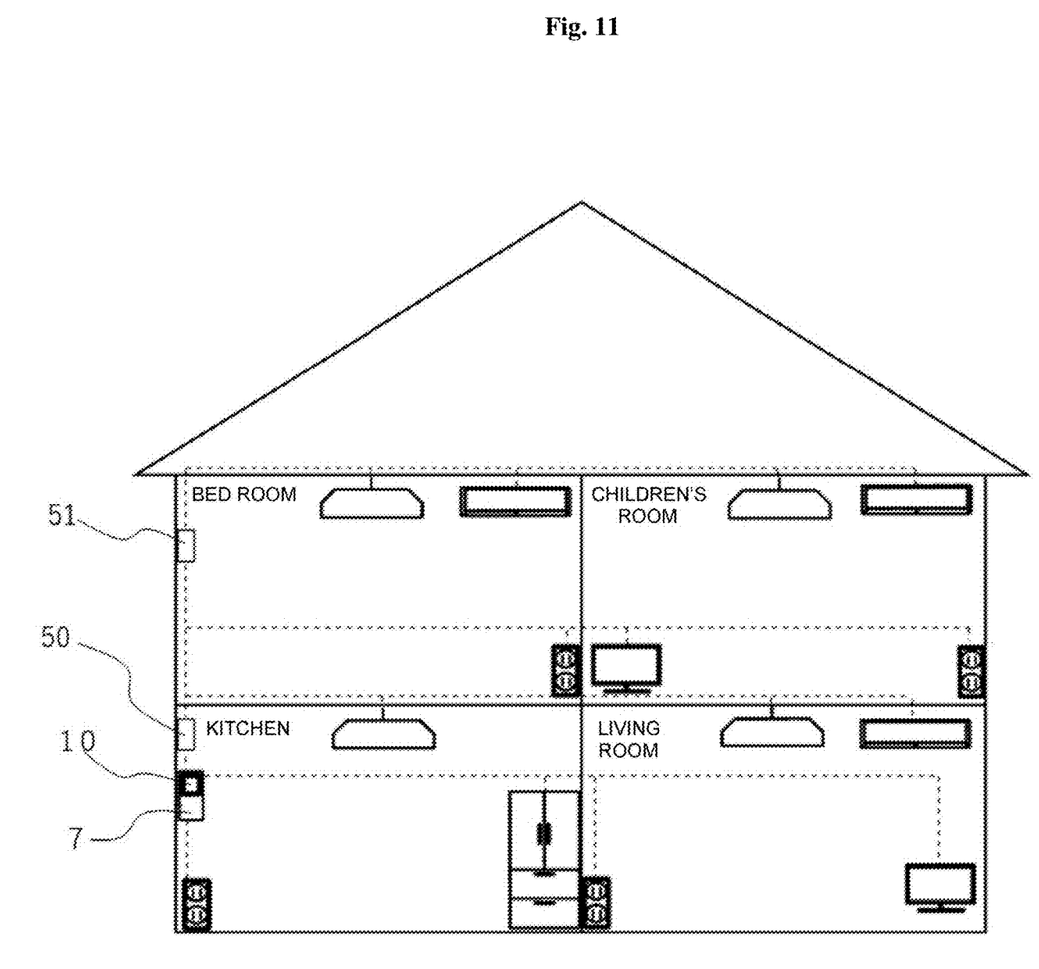
FIG. 11 is a schematic diagram illustrating a building in which the distribution board in FIG. 10 is installed.

FIG. 11 illustrates a building in which the distribution board 7 illustrated in FIG. 10 is installed. As illustrated by broken lines in FIG. 11, each room in the building is provided with indoor wiring. The distribution board 7 is electrically connected to the indoor wiring in each room. The discharge detection unit 10 built in the distribution board 7 is capable of detecting discharge phenomena occurred in the indoor wiring of respective rooms and electrical appliances electrically connected to the indoor wiring.

The discharge detection device of the present invention is not limited to the embodiments described above. For example, the discharge detection device of the present invention is not limited to the form of a unit built in one housing as illustrated in FIGS. 1, 8, and 10. Moreover, in the distribution board 7 illustrated in FIG. 10, the discharge detection device of the present invention may be provided on the secondary side of each of the plurality of branch breakers 32. In this case, the plurality of discharge detection devices are capable of separately interrupt the plurality of branch breakers 32.

DESCRIPTION OF REFERENCE NUMERALS

1 Discharge Detection Device
11 Noise Detection Section
12 Arithmetic Section
13 Signal Output Section
14 Storage Section
17 Reset Section
18 Output Setting Section
19 Current Sensor
50 Seismograph Sensor
51 Motion Sensor

The invention claimed is:

1. A discharge detection device configured to be capable of detecting a discharge phenomenon via wiring, comprising:
   a noise detection section electrically connected to the wiring and configured to allow a noise component generated by the discharge phenomenon to be input via the wiring and configured to output the noise component if the noise component has a predetermined frequency or more;
   an arithmetic section configured to determine whether a level of the noise component is high by comparing the level of the noise component with a threshold; and
   a storage section configured to store a number of occurrences of the discharge phenomenon and a count-up suspension time as a period of time not to count the number of occurrences of a subsequent discharge phenomenon occurred within a predetermined period of time after occurrence of a previous discharge phenomenon,
   wherein the arithmetic section:
   determines whether a count-up flag causing the count-up suspension time to be measured is turned OFF if the level of the noise component is determined to be high,
   sets the count-up flag to be turned ON, adds "1" to the number of occurrences of the discharge phenomenon and performs a control process selected based on the number of occurrences of the discharge phenomenon if the count-up flag is determined to be turned OFF, and
   does not add "1" to the number of occurrences of the discharge phenomenon if the count-up flag is determined not to be turned OFF.

2. The discharge detection device according to claim 1, further comprising:
   a reset section configured to reset the number of occurrences of the discharge phenomenon stored in the storage section.

3. The discharge detection device according to claim 1, further comprising: an output setting section configured to vary timing to output a signal from the arithmetic section based on an externally input signal.

4. The discharge detection device according to claim 1, further comprising: an alarm for notification of occurrence of the discharge phenomenon using at least either light or sound, wherein the arithmetic section varies a mode of the notification by the alarm based on the number of occurrences of the discharge phenomenon.

5. The discharge detection device according to claim 1, further comprising: a current detection section configured to measure a current value on the occurrence of the discharge phenomenon, wherein the arithmetic section performs a control process selected based on the current value.

* * * * *